United States Patent
Fujiwara et al.

(10) Patent No.: US 7,865,329 B2
(45) Date of Patent: Jan. 4, 2011

(54) ELECTRONIC PEDOMETER

(75) Inventors: Toshiyuki Fujiwara, Chiba (JP); Hisao Nakamura, Chiba (JP); Eriko Noguchi, Chiba (JP)

(73) Assignee: Seiko Instruments Inc. (JP)

( * ) Notice: Subject to any disclaimer, the term of this patent is extended or adjusted under 35 U.S.C. 154(b) by 134 days.

(21) Appl. No.: 12/283,625

(22) Filed: Sep. 12, 2008

(65) Prior Publication Data

US 2009/0082995 A1  Mar. 26, 2009

(30) Foreign Application Priority Data

Sep. 25, 2007 (JP) .............................. 2007-246429
Jan. 29, 2008 (JP) .............................. 2008-017934

(51) Int. Cl.
*G01C 22/00* (2006.01)
*H05K 1/00* (2006.01)

(52) U.S. Cl. ....................................... 702/160; 361/748

(58) Field of Classification Search ................. 702/160; 438/51; 361/748

See application file for complete search history.

(56) References Cited

U.S. PATENT DOCUMENTS 4,023,078 A * 5/1977 Olliges et al. ................ 361/753
2008/0027675 A1 * 1/2008 Noguchi et al. ............. 702/160

OTHER PUBLICATIONS

Patent Abstracts of Japan, publication No. 1287417, publication date Nov. 20, 1989.
Patent Abstracts of Japan, publication No. 2001-134739, publication date May 18, 2001.

* cited by examiner

*Primary Examiner*—Bryan Bui
(74) *Attorney, Agent, or Firm*—Adams & Wilks

(57) ABSTRACT

An electronic pedometer has a case, a main circuit board mounted on the case and supporting an electronic circuit element for signal processing, and a sub-circuit board separate and independent from the main circuit board and mounted to a portion of the case. An acceleration sensor is mounted on the sub-circuit board for detecting a walk of a user and outputting a walk signal corresponding to the walk. A flexible conductive member electrically connects the main circuit board and the sub-circuit board to one another.

20 Claims, 6 Drawing Sheets

ELECTRONIC PEDOMETER

BACKGROUND OF THE INVENTION

1. Field of the Invention

The present invention relates to an electronic pedometer including a circuit board mounted with an acceleration sensor.

2. Description of the Related Art

A general electronic pedometer is constituted by a control portion such as CPU for carrying out various operations and controls in accordance with a program, a time counting portion including a reference clock signal generator and a dividing/timing circuit, a program storing portion such as ROM stored with the program, a data storing portion such as RAM stored with various data of a step number and the like, inputting means for setting time or switching a mode, LCD for displaying time, a step number or the like, a display driver for driving LCD, and a step number sensor as disclosed in, for example, Japanese Patent Publication No. 3493550 (Patent Reference 1). As the step number sensor of the electronic pedometer, a semiconductor acceleration sensor is representative.

As described above, the general electronic pedometer is a portable electronic apparatus constituted by adding a step number counting function to a portable electronic timepiece, and therefore, the electronic pedometer is provided with various functions other than the step counting function. Representing the functions by display modes, there are a time display mode, a stopwatch mode, a step number mode, a distance mode and the like. The modes are switched by operating an external operating member of a change over switch or the like provided to a pedometer case of an exterior or the like by a user. In the respective modes, the external operating member is operated. For example, in the step number mode, a pitch is changed or the like by operating the external operating member.

Owing to such a structure, the semiconductor acceleration sensor constituting the step number sensor of the electronic pedometer not only detects acceleration by walking of the user but detects an acceleration of the electronic pedometer by operating the external operating member. When the acceleration sensor detects the acceleration of the electronic pedometer by operating the external operating member by the user, the semiconductor acceleration sensor generates an accelerating signal similar to that in a case of detecting the acceleration by walking of the user. The acceleration signal is counted as the step number by being operated to process by the control portion, and therefore, the acceleration of the electronic pedometer by operating the external operating member is counted erroneously as the step number.

Hence, according to the electronic pedometer of a background art disclosed in Patent Reference 1 mentioned above, when the user operates the external operating member, counting of the step number is stopped by a constant time period from when the external operating member is operated, a predicted step number is added to a step number value until stopping to count the step number after the predetermined time period has elapsed, thereby, the step number is made to be proximate to an actual step number. The predicted step number is a step number by which the user is predicted to walk during the predetermined time period and is calculated by, for example, by multiplying an average step number per unit time immediately before stopping to count the step number by the predetermined time period.

In this way, the electronic pedometer of the background art is on a premise that the step number which differs from the actual step number is counted by operating the external operating member, counting of the actual step number is stopped by the constant time period from when the external operating member is operated, and the predicted step number during the stop period calculated by the predetermined operation processing is added to the step number until stopping to count the step number. Therefore, when the external operating member is operated in walking, the electronic pedometer of the background art can display certainly a value proximate to the actual step number. However, the electronic pedometer of the background art adds to process the predicted step number even when the external operating number is operated in stopping to walk, and therefore, there poses a problem that the displayed step number differs from the actual step number. Further, when the external operating member is operated, there is a case in which a walk pitch which differs from the walk pitch until when the pedometer is operated is constituted, however, the predicted step number is not calculated in correspondence with a change in the walk pitch, and therefore, there poses a problem that the displayed step number differs from the actual step number. The problems are caused because the electronic pedometer of the background art is constituted by a structure which cannot count only the actual step number.

Meanwhile, expressing structurally, according to the electronic pedometer of the background art, as shown by FIG. 9 through FIG. 10, a circuit board 10 mounted with an electronic circuit element for executing a signal processing and an acceleration sensor 4 is arranged at inside of a pedometer case 1, and an outer peripheral edge thereof is fixed to the pedometer case 1 by a board fixing portion 6 at two portions through four portions. When an external force is exerted to the pedometer case 1 of such an electronic pedometer, a strain generated the pedometer case 1 is transmitted to the circuit board 10. The strain is propagated to the acceleration sensor, thereby, the acceleration sensor 4 generates a strain detecting signal in response to the strain. The strain detecting signal is processed as a step number signal by the electronic circuit element for signal processing mounted to the circuit board 10 and an erroneous step number which is not the actual step number is counted. The external force is generated also when an unanticipated impact or an excessively large pressure is applied in mounting or detaching the electronic pedometer, or when the electronic pedometer is impacted to something carelessly other than when exerted by operating the external operating member. However, there poses a problem that a method of preventing an erroneous operation of the electronic pedometer by a software as described in Patent Reference 1 is not applicable to such an unanticipated external force.

JP-A-1-287417 (Patent Reference 2) describes an electronic pedometer constituted by attaching a damping member comprising an elastic member to one face of a printed board, attaching one end of an acceleration detecting type sensor comprising a piezoelectric element to the damping member to form the acceleration detecting type sensor as a cantilever, and attaching to a free end of the sensor. According to the electronic pedometer including the step number sensor attached with the acceleration detecting type sensor at the cantilever, up and down rocking of the cantilever generated in accordance with an acceleration of an up and down movement is detected by the acceleration detecting type sensor, thereby, the step number is counted. According to the electronic pedometer having such a unique structure, the acceleration detecting type sensor does not respond to a movement having a high frequency and constituting noise by interposing the damping member. Therefore, the electronic pedometer can prevent an erroneous operation by an external force exerted to the pedometer case and the external force for generating a movement having a high frequency and constituting noise.

However, the electronic pedometer described in Patent Reference 2 needs to use the acceleration detecting type sensor of a special structure, and therefore, there poses a problem that cost is increased by that amount and a size or a shape of the pedometer case is restricted. Further, only a movement having a high frequency and constituting noise can be absorbed by the damping member constituting an indispensable constituent element of the acceleration detecting type sensor of the special structure, and therefore, there poses a problem that the electronic pedometer is erroneously operated when an external force generating the other movement is exerted to the pedometer case.

SUMMARY OF THE INVENTION

A problem to be resolved by the invention is to provide an electronic pedometer of low cost which is not erroneously operated even when an external force is exerted to a pedometer case without using an acceleration sensor of a special structure and without executing a signal processing for removing a disturbance by a software.

In order to resolve the problem, in an electronic pedometer for detecting a step number by an acceleration sensor, a circuit board is constituted by two sheets of a main board mounted with an electronic circuit element for executing a signal processing and a sub board mounted with the acceleration sensor, and the sub board is arranged at inside of the pedometer case so as not to receive a strain from the main board and the pedometer case.

That is, a first electronic pedometer for resolving the problem is an electronic pedometer for detecting a step number by an acceleration sensor, wherein a circuit board is constituted by two sheets of a main board mounted with an electronic circuit element for executing a signal processing and a sub board mounted with the acceleration sensor, the sub board is fixed to a pedometer case at one portion and an interval between the sub board and the main board is connected by a flexible conductive member.

Further, a second electronic pedometer for resolving the problem is an electronic pedometer for detecting a step number by an acceleration sensor, wherein a circuit board is constituted by two sheets of a main board mounted with an electronic circuit element for executing a signal processing and a sub board mounted with the acceleration sensor, the sub board is fixed to the main board by way of a fixing member having a flexibility and an interval between the sub board and the main board is connected by a flexible conductive member.

By the invention, an electronic pedometer of low cost which is not erroneously operated even when an external force is exerted to the pedometer case can be provided without using an acceleration sensor of a special structure. Although according to the electronic pedometer of the invention, a strain by the external force exerted to the pedometer case is generated only at the main board and is not generated at the sub board. Further, the external force includes a pressure by an unanticipated impact applied to the pedometer case, a pressure when a user operates an external operating member of a change over switch or the like provided to the pedometer case and the like.

DETAILED DESCRIPTION OF THE PREFERRED EMBODIMENTS

An electronic pedometer according to the invention is characterized in that a circuit board is constituted by two sheets of a main board mounted with an electronic circuit element for executing a signal processing and a sub board mounted with the acceleration sensor, the main board is fixed to a pedometer case at a plurality of portions, and the sub board is formed by a flexible circuit board and fixed to the main board by a fixing member having a flexibility.

Embodiment 1

An electronic pedometer of Embodiment 1 of the invention is characterized in an electronic pedometer including an acceleration sensor, a main board mounted with an electronic circuit element for executing a signal processing, and a sub board mounted with the acceleration sensor, wherein the main board is fixed to a pedometer case at a plurality of portions, and the sub board is fixed to the pedometer case at one portion and connects an interval between the main board and the sub board by a flexible conductive member.

Figure 1:
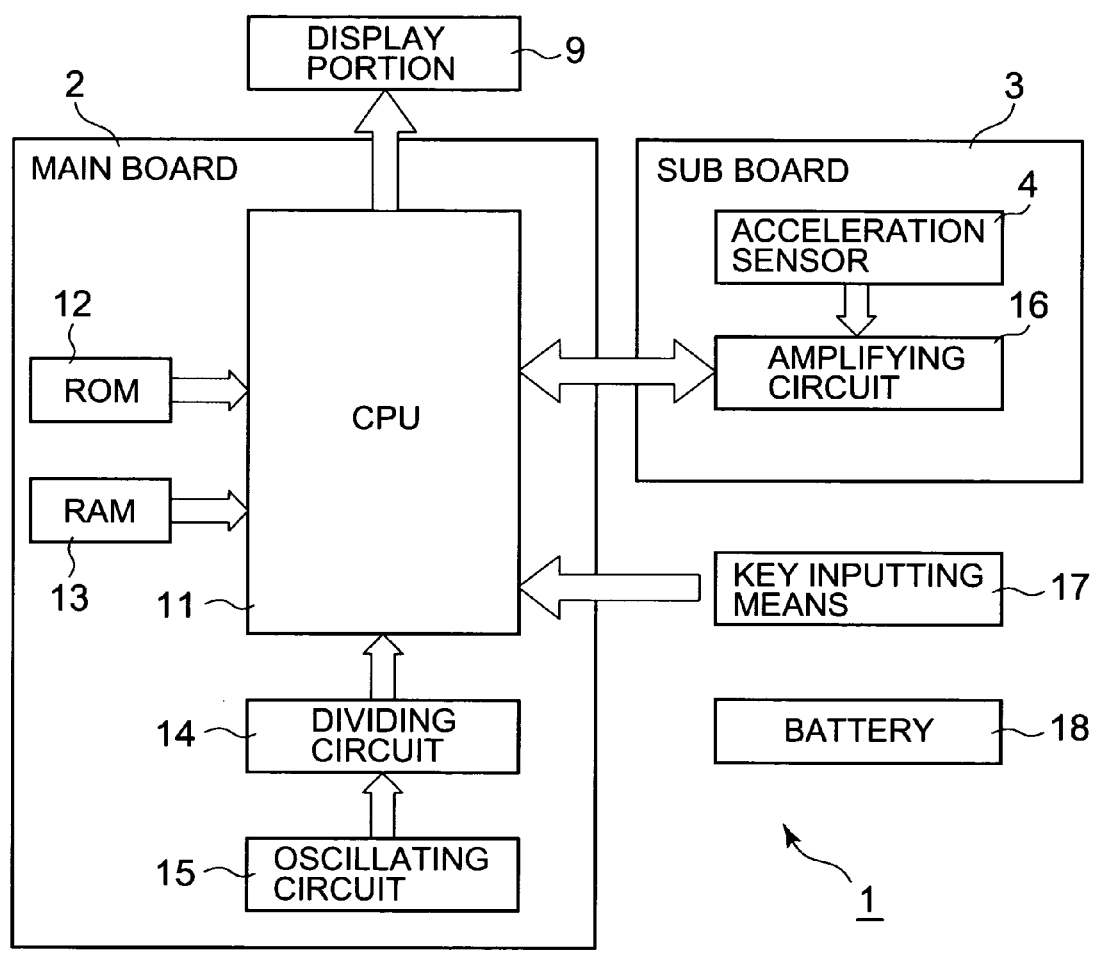
FIG. 1 is a block circuit diagram of an electronic pedometer of Embodiment 1 of the invention.
Figure 2:
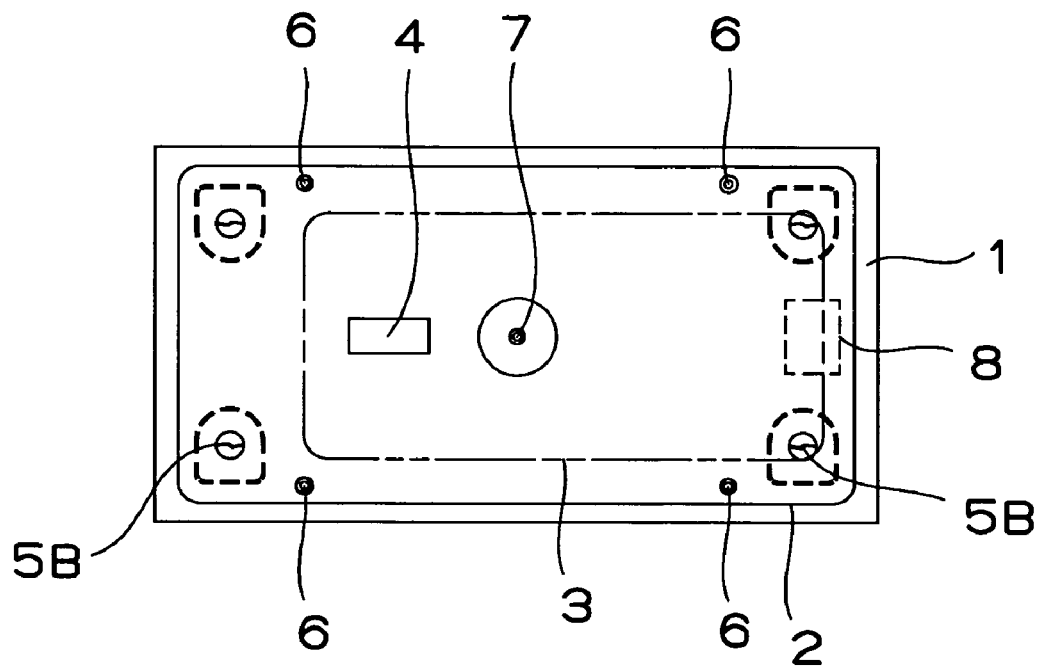
FIG. 2 is a plane view of the electronic pedometer of Embodiment 1 of the invention shown by removing a display panel and removing an electronic circuit element of IC or the like from a circuit unit.
Figure 3:
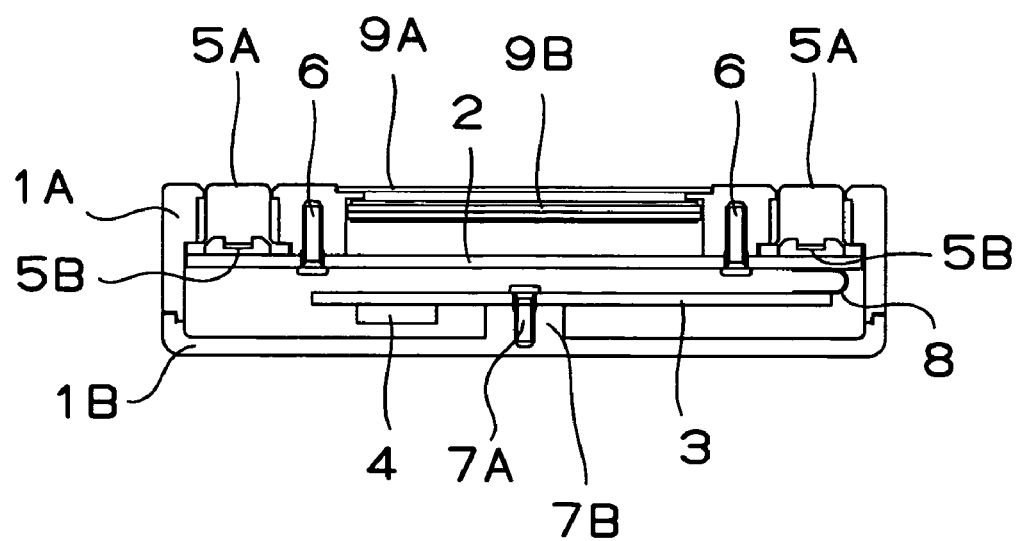
FIG. 3 is a sectional view of the electronic pedometer of Embodiment 1 of the invention.

That is, as shown by a block circuit diagram of FIG. 1, an electronic pedometer 1 of Embodiment 1 is constituted by including two sheets of separate circuit boards, that is, a first or main board 2 (main circuit board) mounted with an electronic circuit element for executing a signal processing and a second or sub board 3 (sub-circuit board) mounted with an acceleration sensor 4. More specifically, as shown in FIGS. 1-3, the circuit boards 2 and 3 are separate and independent from one another and, as described below, are electrically connected together by a flexible conductive member 8. The main board 2 is mounted with a CPU 11 for executing various operations and controls in accordance with a program, an oscillating circuit 15, a dividing circuit 14, a ROM 12 mounted with the program, and a RAM 13 stored with various data of a step number and the like. Next, the sub board 3 is mounted with an electronic circuit element constituting the semiconductor acceleration sensor 4 and an amplifying circuit 16. A pedometer module contained in a module containing portion of the pedometer case 1 is constituted by including the main board 2, the sub board 3 and a liquid crystal display portion 9.

Figure 4:
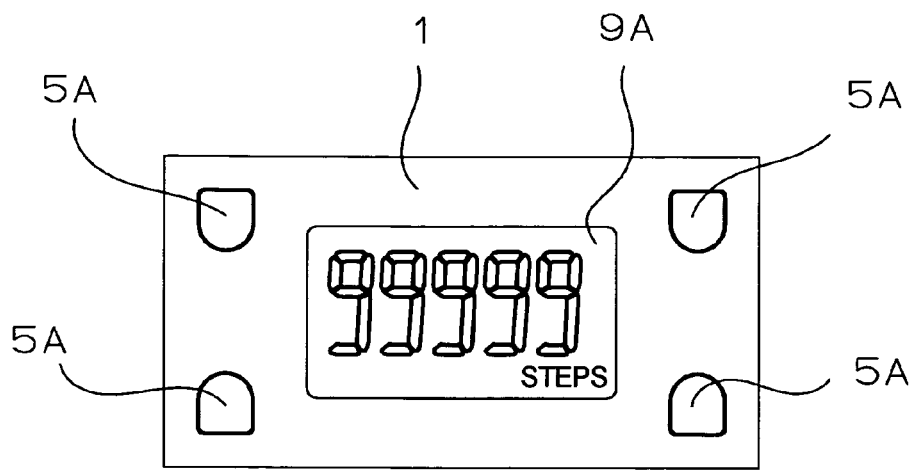
FIG. 4 is a plane view of the electronic pedometer of Embodiment 1 of the invention.

The main board 2 is a glass epoxy board of a shape and a dimension in correspondence with a rectangular module containing portion of the pedometer case 1, a surface thereof is formed with a printed circuit, and mounted with an electronic circuit element for executing the above-described signal processing. The main board 2 is fixed to a peripheral edge portion of the pedometer case 1 at four portions of board fixing portions 6 as shown by FIG. 2 through FIG. 4.

The pedometer case 1 is constituted by a plastic case main body 1A having a rectangular module containing portion opened to a back side and a case back 1B. A surface of the case main body 1A is formed with a rectangular display window at a center portion thereof, and four corners of the case are respectively formed with external operating member guide holes respectively opened to a case surface and the module containing portion. Four corners of the main board 2 are formed with switch patterns of switch portions 5B at positions in correspondence with the external member guide holes. The switch pattern is electrically connected to the printed circuit.

The sub board 3 is a glass epoxy board of a predetermined shape and a predetermined dimension, and a surface thereof is formed with a printed circuit, and mounted with the electronic circuit element constituting the semiconductor acceleration sensor 4 and the amplifying circuit 16 as described above. As shown by FIG. 2 and FIG. 3, the sub board 3 is fixed to the pedometer case 1 at one portion of a board fixing portion 7 by fixing means of a screw or the like and an interval between the sub board 3 and the main board 2 are electrically connected by a flexible conductive member 8.

That is, the sub board 3 mounted with the semiconductor acceleration sensor 4 is fixed by screwing a fixing screw 7A to a boss 7B integrally formed with a center portion of the case back 1B of the pedometer case 1 by way of an attaching hole of the sub board 3. Further, the printed circuit of the sub board 3 and the printed circuit of the main board 2 are electrically connected by a heat seal connector constituting the flexible conductive member 8. In sum, the acceleration sensor 4 is provided with a sensitivity axis in a plane direction of the sub board 3 and the sub board 3 is arranged in parallel with a bottom face of the pedometer case 1 and is fixed thereto at one portion.

In integrating the electronic pedometer of Embodiment 1, switch operating members 5A of 4 pieces of operating buttons or the like are inserted to be arranged at guide holes formed at four corners of the case main body 1A movably in axial directions such that head portions thereof are exposed to the surface of the case main body 1A. Next, a pedometer module is contained in the module containing portion from a back side opening of the case main body 1A. Then, an upper side of a peripheral edge of the main board 2 is brought into contact with a board attaching stepped portion formed at an inner side face of the module containing portion of the case main body 1A, and a liquid crystal display unit 9B of the liquid crystal display portion 9 is disposed at a display window formed at a case surface.

Next, the peripheral edge of the main board 2 is screwed to the main board attaching stepped portion at 4 portions of the board fixing portions 6 by fixing screws from the back side of the case main body 1A, thereby, the pedometer module is fixed to the case main body 1A. The main board attaching stepped portion is formed at a position of forming a space in which the sub board 3 mounted with the semiconductor acceleration sensor 4 is contained downward from the main board 2. Finally, a back side opening of the case main body 1A is enclosed by the case back 1B. In this case, the case back 1B is already fixed with the sub board 3 at one portion of the fixing portion 7. Further, although not illustrated in FIG. 1 and FIG. 2, key inputting means 17 shown in FIG. 4 is arranged at a side face of the case main body 1A, and a battery 18 is contained at inside of the module containing portion of the pedometer case 1.

Meanwhile, the display window on the surface side of the case main body 1A is enclosed by a display window glass 9A before integrating the pedometer module to the case main body 1A. Further, a rubber switch is arranged above the switch pattern of the switch portion 5B formed at the main board 2 before integrating the pedometer module to the case main body 1A. The rubber switch is a switch which is electrically conducted by being pressed by a front end of the switch operating member 5A to make the switch portion 5B electrically conducted and make the switch portion 5B not conducted by being brought into an electrically insulated state when not pressed by the front end of the switch operating member 5A. The rubber switch is an elastic member, and therefore, normally, that is, when not operated, the rubber switch functions as a spring member for pushing up the switch operating member 5A in a direction of the surface of the case main body 1A.

According to the electronic pedometer of Embodiment 1 of the invention constituted as described above, when a pressure by an unanticipated impact is applied to the pedometer case 1, a strain resulting by the applied pressure is generated at the pedometer case 1. Then, the strain is propagated in the main board 2. According to the main board 2 mounted with the electronic circuit element for executing the signal processing, the peripheral edge is fixed to the pedometer case 1 at four portions, and at least at two portions thereof. However, the strain is not propagated to the sub board 3 mounted with the acceleration sensor 4. The acceleration sensor 4 is provided with the sensitivity axis in the plane direction of the sub board 3, and the sub board 3 is arranged in parallel with the bottom face of the pedometer case 1 and fixed thereto at one portion. Further, because the heat seal connector constituting the flexible conductive member 8 is adopted for electrically connecting the sub board 3 and the main board 2, the strain propagating in the main board 2 is hampered by the flexible conductive member 8 and is not propagated to the sub board 3.

When a stress is applied to the switch portion 5B by operating the switch operating portion 5A of the external operating portion 5 by the user, a strain by the stress is generated at the switch portion 5B of the main board 2 and propagates in the main board 2. However, the strain is not propagated to the sub board 3 mounted with the acceleration sensor 4 because the sub board 3 is fixed to the pedometer case 1 at one portion and the heat seal connector constituting the flexible conductive member 8 is adopted for electrically connecting the sub board 3 to the main board 2. That is, the strain propagating in the main board 2 is hampered by the flexible conductive member 8 and is not propagated to the sub board 3.

Although the electronic pedometer of Embodiment 1 has been explained in details as described above, the sub board 3 is not limited to be arranged at inside of the pedometer case 1 to constitute two layers along with the main board 2, but may naturally be arranged at inside of the pedometer case 1 to constitute the same plane. Further, the method of fixing the sub board 3 to the pedometer case 1 is not naturally limited to the method of fixing the sub board 3 to the pedometer case 1 by screwing the fixing screw 7A to a single piece of the fixing boss 7B formed at the bottom face of the pedometer case 1.

Embodiment 2

An electronic pedometer of Embodiment 2 of the invention is characterized in an electronic pedometer for detecting a step number by an acceleration sensor, wherein a circuit board is constituted by two sheets of a main board mounted with an electronic circuit element for executing a signal processing and a sub board mounted with the acceleration sensor, the sub board is fixed to the main board by way of a fixing member having a flexibility and an interval between the main board and the sub board is connected by a flexible conductive member. Therefore, the electronic pedometer of Embodiment 2 differs in a constitution of arranging the sub board at inside of the pedometer case so as not to receive a strain from the main board and the pedometer case and other constitution is the same as that of Embodiment 1.

Figure 5:
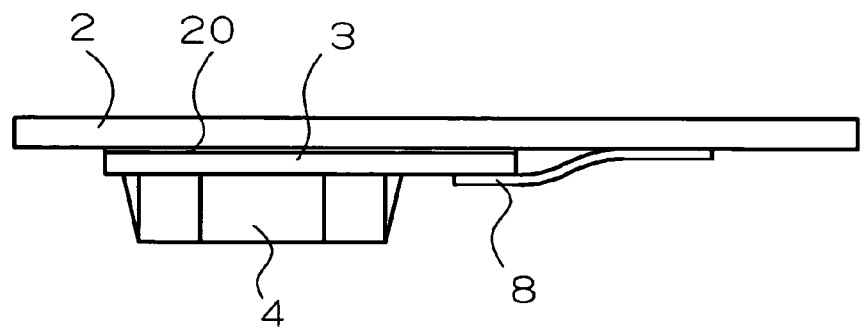
FIG. 5 is a sectional view of an electronic pedometer of Embodiment 2 of the invention.

That is, as shown by FIG. 5, the electronic pedometer of Embodiment 2 includes the main board 2 mounted with an electronic circuit element for executing a signal processing and the sub board 3 mounted with the acceleration sensor 4. The sub board 3 is fixed to the main board 2 by way of the fixing member 20 having the flexibility. Further, an interval between the printed circuit of the sub board 3 and the printed circuit of the main board 2 is electrically connected by a heat seal connector constituting the flexible conductive member 8.

Figure 6:
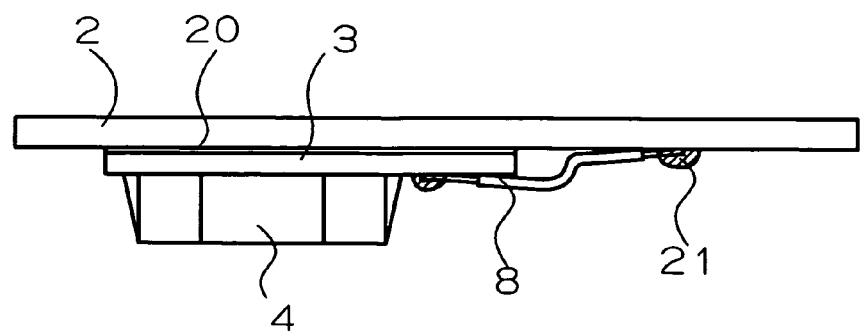
FIG. 6 is a sectional view of a modified example of the electronic pedometer of Embodiment 2 of the invention.

Further, as shown by FIG. 6, the electronic pedometer of Embodiment 2 includes the main board 2 mounted with an electronic circuit element for executing a signal processing, and the sub board 3 mounted with the acceleration sensor 4. The sub board 3 is fixed to the main board 2 by way of the fixing member 20 having the flexibility. Further, the interval between the printed circuit of the sub board 3 and the printed circuit of the main board 2 is electrically connected by a flat cable constituting the flexible conductive member 8.

The fixing member 20 having the flexibility is a double coated adhering tape coated with an acrylic species adhering agent, an acrylic species adhering agent or a silicone species adhering agent.

Further, similar to Embodiment 1, the sub board 3 is a glass epoxy board having a predetermined shape and a predetermined dimension, the acceleration sensor 4 is provided with the sensitivity axis in the plane direction of the sub board 3, and the main board 2 is arranged in parallel with the bottom face of the pedometer case and fixed thereto at the plurality of portions.

According to the electronic pedometer of Embodiment 2 of the invention constituted as described above, when a pressure by an unanticipated impact is applied to the pedometer case 1, a strain by the pressure is generated at the pedometer case 1. Then, the strain is propagated in the main board 2. Because the main body 2 mounted with the electronic circuit element for executing the signal processing is fixed to the pedometer case 1. However, the strain is not propagated to the sub board 3 mounted with the acceleration sensor 4. Because the acceleration sensor 4 is provided with the sensitivity axis in the plane direction of the sub board 3 and the sub board 3 is fixed to the main board 2 by way of the fixing member 20 having the flexibility. Further, the heat seal connector or the flat cable constituting the flexible conductive member 8 is adopted for electrically connecting the sub board 3 and the main board 2, thereby, the strain propagating in the main board 2 is hampered by the flexible conductive member 8 and is not propagated to the sub board 3.

Embodiment 3

An electronic pedometer of Embodiment 3 of the invention is characterized in an electronic pedometer for detecting a step number by an acceleration sensor, wherein a circuit board is constituted by two sheets of a main board mounted with an electronic circuit element for executing a signal processing and a sub board mounted with the acceleration sensor, the sub board is formed by a flexible circuit board and fixed to the main board by way of a fixing member having a flexibility, and an interval between the sub board and the main board is connected by a flexible conductive member utilizing a portion of the flexible circuit board.

That is, according to the electronic pedometer of Embodiment 3 of the invention, different from Embodiment 1 and Embodiment 2 in which the sub board 3 is formed by the glass epoxy board, the sub board 3 is formed by the flexible circuit board. Further, the sub board 3 of the flexible circuit board mounted with the acceleration sensor is fixed to the main board mounted with the electronic circuit element for executing the signal processing by way of the fixing member having the flexibility similar to Embodiment 2. However, electric connecting means between the printed circuit of the sub board and the printed circuit of the main board realizes the function of the flexible conductive member of Embodiment 2 by utilizing a portion of the flexible circuit board forming the sub board.

Figure 7:
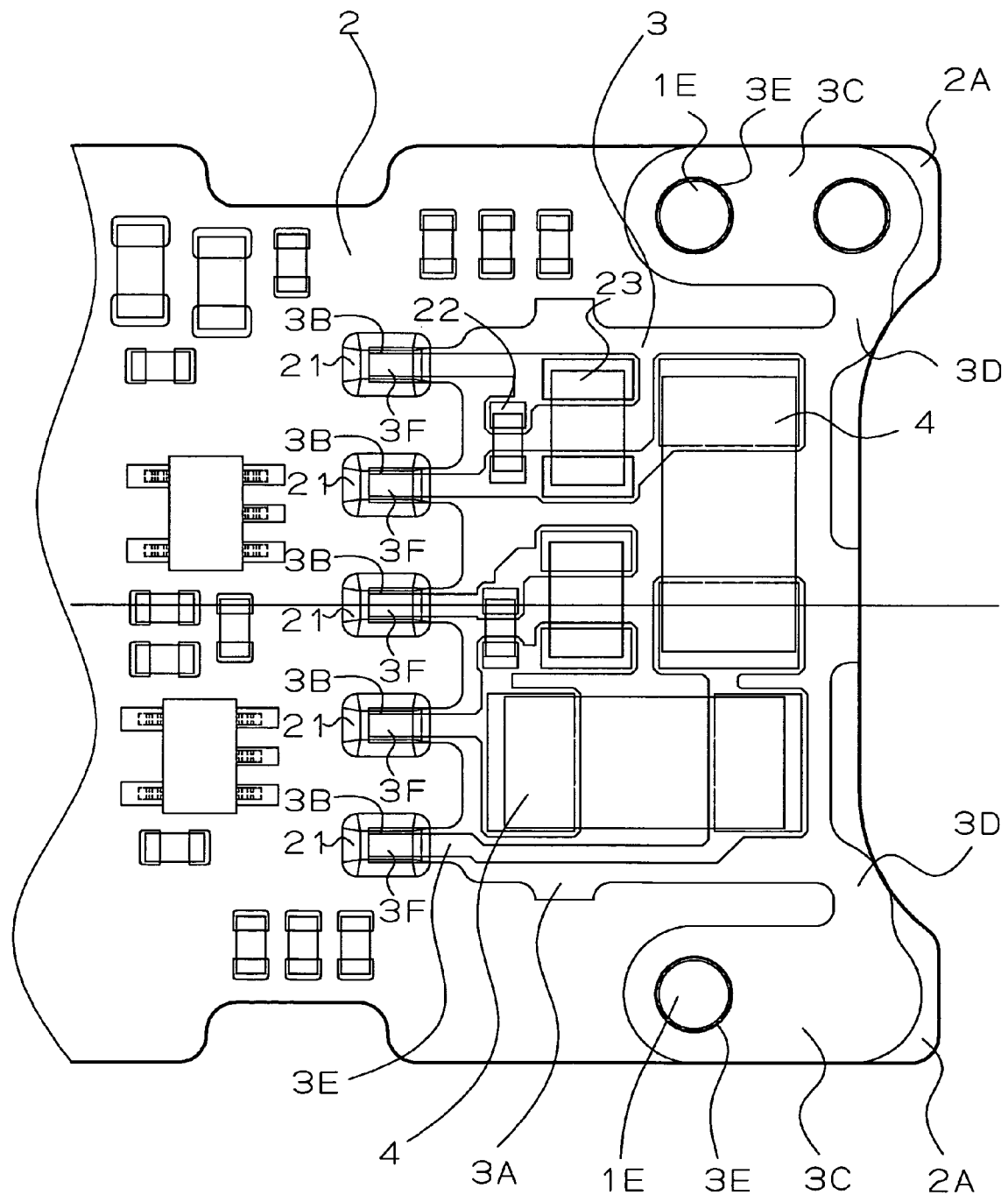
FIG. 7 is a partial plane view of an electronic pedometer of Embodiment 3 of the invention constituted by a plane view of a sub board mounted with an electronic circuit element of a semiconductor acceleration sensor or the like and a partial plane view of a main board mounted with a sub board.
Figure 8:
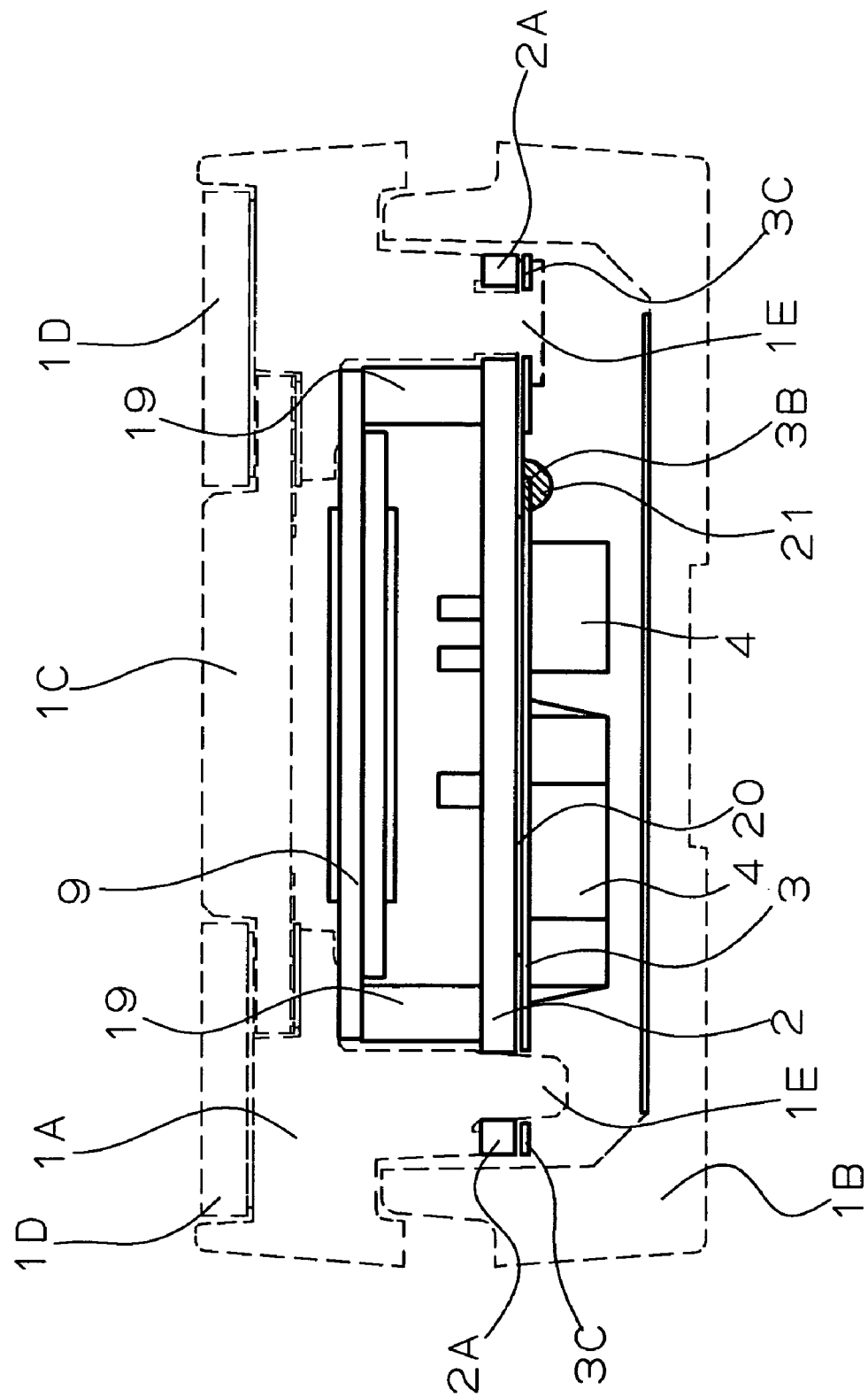
FIG. 8 is a sectional view of the electronic pedometer of Embodiment 3 of the invention.
Figure 9:
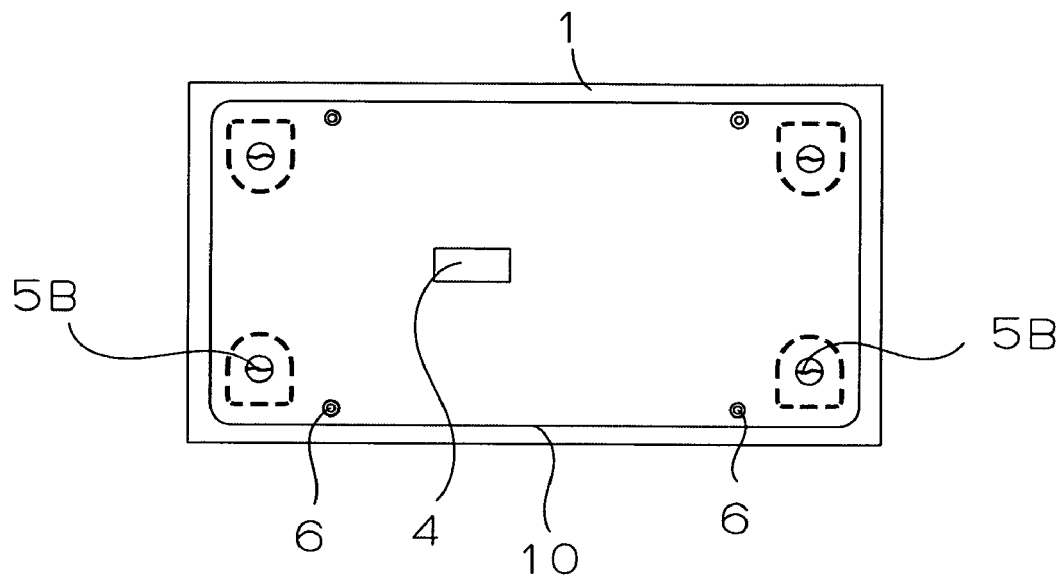
FIG. 9 is a plane view of an electronic pedometer of a background art.
Figure 10:
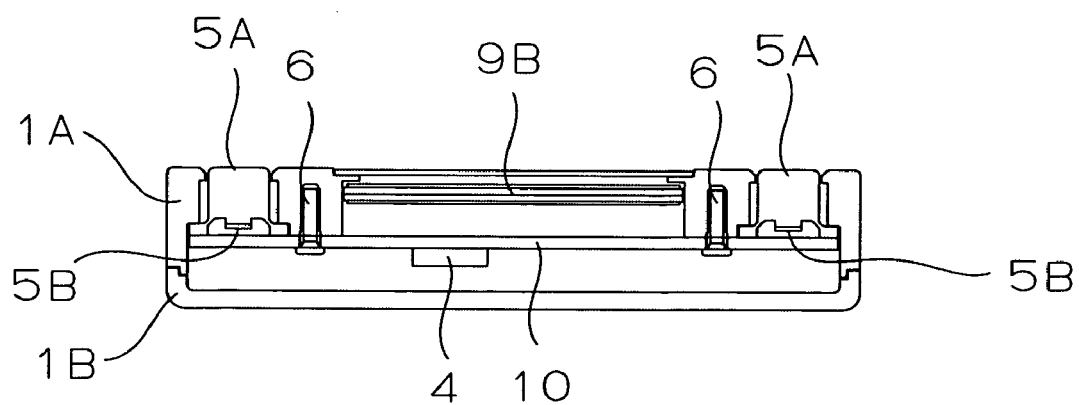
FIG. 10 is a sectional view of the electronic pedometer of the background art.

Explaining further in details, as shown by FIG. 8, the sub board 3 mounted with an electronic circuit element of the acceleration sensor 4 or the like is fixed to the main board 2 mounted with the electronic circuit element for executing the signal processing by way of the fixing member 20 having the flexibility. The sub board 3 is formed by the flexible circuit board, as shown in FIG. 7 and constituted by an electronic circuit element mounting region 3A, four of terminal regions 3B, two of locking regions 3C, a narrow portion 3D formed between the electronic circuit element mounting region 3A and the locking region 3C, and a printed circuit 3E formed on the sub board 3. The electronic circuit element mounting region 3A is mounted with electronic circuit elements of the acceleration sensor 4, a resistor 22, a capacitor 23 and the like. Five of the terminal regions 3B are formed by being extended from the electronic circuit element mounting region 3A in a left direction of FIG. 7, and therefore, in a direction of a center portion of the main board 2 in a projected shape. The locking regions 3C are formed by being respectively extended from the electronic circuit element mounting region 3A to upper and lower sides in a right direction of FIG. 7, and therefore, in upper and lower directions of one end portion 2A of the main board 2. Five of terminal portions 3F of the printed circuit pattern 3E are formed in a projected shape in correspondence with five of the terminal region 3B in a projected shape of the sub board 3.

The pedometer case 1 is constituted by an upper case 1A of a plastic having the rectangular module containing portion opened to the back side, a lower case 1B, a glass 1C for closing an opening portion of the upper case 1A, and a holding plate 1D of the glass 1C. The locking region 3C of the sub board 3 is formed with a through hole 3E for receiving a coupling projected portion 1E formed at the upper case 1A for coupling the upper case 1A and the lower case 1B of the pedometer case 1.

The fixing member 20 having the flexibility is a double coated adhering tape coated with an acrylic species adhering agent, an acrylic species adhering agent or a silicone species adhering agent.

Further, electric connecting means between the printed circuit 3E of the sub board 3 and the printed circuit of the main board 2 is realized by utilizing a portion of the flexible circuit board forming the sub board 3. That is, the electric connecting means is realized by five of the terminal regions 3B formed by being extended from the electronic circuit element mounting region 3A of the sub board 3 in the direction of the center portion of the main board 2 in the projected shape and five of the terminal portions 3F in the projected shape of the printed circuit 3E extended to the terminal regions. Further, the five projected shape terminal portions 3F of the sub board 3 are soldered (21) to corresponding terminal portions of the printed circuit of the main board 2.

Further, the acceleration sensor 4 is provided with the sensitivity in the plane direction of the sub board 3, the main board 2 is interposed by the upper case and the lower case of the pedometer case 1, arranged in parallel with the bottom face and fixed thereto by the plurality of portions.

According to the electronic pedometer of Embodiment 3 of the invention constituted as described above, when a pressure by an unanticipated impact is applied to the pedometer case 1, a strain by the pressure is generated at the pedometer case 1. Then, the strain is propagated in the main board 2. Because the main board 2 mounted with the electronic circuit element for executing the signal processing is fixed to the pedometer case 1. However, the strain is not propagated to the sub board 3 mounted with the acceleration sensor 4. Because the acceleration sensor 4 is provided with the sensitivity axis in the plane direction of the sub board 3, and the sub board 3 is fixed to the main board 2 by way of the fixing member 20 having the flexibility. Further, the electric connection of the sub board 3 and the main board 2 is realized by the flexible conductive member formed by utilizing a portion of the sub board 3 constituting the flexible circuit board, that is, the five terminal regions 3B formed by being extended in the projected shape from the electronic element mounting region 3A of the sub board 3, and therefore, the strain propagating in the main board 2 is hampered by the flexible conductive member and is not propagated in the sub board 3.

Further, as shown by the plane view of FIG. 7, in Embodiment 3, the sub board 3 includes the two locking regions 3C and the locking regions 3C are pinched by the upper case 1A and the lower case 1B. Therefore, also the sub board 3 includes a region fixed to the pedometer case 1. However, the strain generated at the case is not transmitted to the electronic element mounting region 3A of the sub board 3 by way of the locking region 3C. Because the flexible narrow portion 3D is formed between the electronic circuit element mounting region 3A and the locking region 3C of the sub board 3. Further, the locking region 3C is not necessarily needed in view of the function of Embodiment 3.

What is claimed is:

1. An electronic pedometer for detecting a walk of a user and a number of steps of the user based on a walk signal corresponding to the walk, the electronic pedometer comprising: a pedometer case; a main circuit board supporting an electronic circuit element for signal processing and mounted to a plurality of portions of the pedometer case; a sub-circuit board separate and independent from the main circuit board and mounted to one portion of the pedometer case; an acceleration sensor mounted on the sub-circuit board for detecting a walk of a user and outputting a walk signal corresponding to the walk; and a flexible conductive member electrically connecting the main circuit board and the sub-circuit board to one another.

2. An electronic pedometer according to claim 1; wherein the acceleration sensor has a sensitivity axis in a plane direction of the sub-circuit board, and the sub-circuit board is arranged in parallel with a bottom face of the pedometer case and fixed thereto at the one portion of the pedometer case.

3. An electronic pedometer according to claim 1; wherein the sub-circuit board is arranged in the pedometer case so as to extend generally parallel to the main circuit board.

4. An electronic pedometer according to claim 2; wherein the sub-circuit board is arranged in the pedometer case so as to extend generally parallel to the main circuit board.

5. An electronic pedometer according to claim 1; wherein the sub-circuit board and the main circuit board are arranged in the pedometer case so as to extend along a common plane.

6. An electronic pedometer according to claim 2; wherein the sub-circuit board and the main circuit board are arranged in the pedometer case so as to extend along a common plane.

7. An electronic pedometer according to claim 1; wherein the sub-circuit board is fixed by a screw to one piece of a fixing boss formed at the bottom face of the pedometer case.

8. An electronic pedometer according to claim 2; wherein the sub-circuit board is fixed by a screw to one piece of a fixing boss formed at the bottom face of the pedometer case.

9. An electronic pedometer according to claim 3; wherein the sub-circuit board is fixed by a screw to one piece of a fixing boss formed at the bottom face of the pedometer case.

10. An electronic pedometer according to claim 4; wherein the sub-circuit board is fixed by a screw to one piece of a fixing boss formed at the bottom face of the pedometer case.

11. An electronic pedometer according to claim 5; wherein the sub-circuit board is fixed by a screw to one piece of a fixing boss formed at the bottom face of the pedometer case.

12. An electronic pedometer according to claim 6; wherein the sub-circuit board is fixed by a screw to one piece of a fixing boss formed at the bottom face of the pedometer case.

13. An electronic pedometer for detecting a walk of a user and a number of steps of the user based on a walk signal corresponding to the walk, the electronic pedometer comprising: a main circuit board supporting an electronic circuit element for signal processing; a sub-circuit board separate and independent from the main circuit board; an acceleration sensor mounted on the sub-circuit board for detecting a walk of a user and outputting a walk signal corresponding to the walk; a flexible fixing member connecting the sub-circuit board to the main circuit board; and a flexible conductive member electrically connecting the main circuit board and the sub-circuit board to one another.

14. An electronic pedometer according to claim 13; wherein the sub-circuit board comprises a flexible circuit board and the flexible conductive member comprises a portion of the flexible circuit board.

15. An electronic pedometer according to claim 14; wherein the portion of the flexible circuit board is a terminal portion having a projected shape.

16. An electronic pedometer according to claim 13; wherein the flexible fixing member comprises a double-coated adhering tape coated with an acrylic species adhering agent.

17. An electronic pedometer according to claim 13; wherein the flexible fixing member comprises one of an acrylic species adhering agent or a silicone species adhering agent.

18. An electronic pedometer comprising:
a case;
a first circuit board supporting an electronic circuit element for signal processing, the first circuit board being connected to at least two connection points of the case;
a second circuit board separate and independent from and connected to the first circuit board;

an acceleration sensor mounted on the second circuit board for detecting a walk of a user and outputting a walk signal corresponding to the walk; and means for flexibly connecting the second circuit board to the first circuit board so that an external force acting on the case is transmitted to the first circuit board but does not propagate to the second circuit board.

19. An electronic pedometer according to claim 18; wherein the means for flexibly connecting comprises a flexible connecting member connecting the second circuit board directly to the first circuit board and a flexible conductive member electrically connecting the first and second circuit boards to one another.

20. An electronic pedometer according to claim 19; wherein the acceleration sensor has a sensitivity axis in a plane direction of the second circuit board.

* * * * *